US007590914B2

(12) United States Patent
Kim et al.

(10) Patent No.: US 7,590,914 B2
(45) Date of Patent: Sep. 15, 2009

(54) DECODING APPARATUS FOR LOW-DENSITY PARITY-CHECK CODES USING SEQUENTIAL DECODING, AND METHOD THEREOF

(75) Inventors: Sunghwan Kim, Seoul (KR);
Yong-June Kim, Seoul (KR);
Jong-Seon No, Seoul (KR); Sang-Hyun Lee, Daejeon (KR); Yun-Hee Kim, Daejeon (KR); Jae-Young Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 578 days.

(21) Appl. No.: 11/105,922

(22) Filed: Apr. 13, 2005

(65) Prior Publication Data

US 2005/0229087 A1    Oct. 13, 2005

(30) Foreign Application Priority Data

Apr. 13, 2004    (KR)    ...................... 10-2004-0025345

(51) Int. Cl.
*H03M 13/00*    (2006.01)
(52) U.S. Cl. ......................... 714/752; 714/786; 714/799
(58) Field of Classification Search .................. 714/752, 714/758, 799, 786
See application file for complete search history.

(56) References Cited

U.S. PATENT DOCUMENTS 6,938,196 B2 *  8/2005  Richardson et al. ......... 714/752

7,281,192 B2 * 10/2007  Shen et al. .................. 714/757
2003/0023917 A1 *  1/2003  Richardson et al. ......... 714/749
2003/0033575 A1 *  2/2003  Richardson et al. ......... 714/799
2005/0154957 A1 *  7/2005  Jacobsen .................... 714/752

FOREIGN PATENT DOCUMENTS

| KR | 2003-016720 | 3/2003 |
| KR | 1020030095144 A | 12/2003 |
| KR | 10-2004-0000060 | 1/2004 |
| KR | 10-2004-0004162 | 1/2004 |
| KR | 1020040014723 A | 2/2004 |

* cited by examiner

*Primary Examiner*—Esaw T Abraham
(74) *Attorney, Agent, or Firm*—Blakely, Sokoloff, Taylor & Zafman LLP

(57) ABSTRACT

Disclosed is a decoding apparatus for LDPC (Low-Density Parity-Check) codes when receiving data encoded with LDPC codes on a channel having consecutive output values, and a method thereof. The decoding method for LDPC codes uses sequential decoding and includes the following steps: (a) the nodes are divided according to a parity-check matrix into check nodes for a parity-check message and variable nodes for a bit message; (b) the check nodes are divided into a predetermined number of subsets; (c) the LDPC codeword of each subset for all the check nodes is sequentially decoded; (d) an output message is generated for verifying validity of the decoding result; and (e) the steps (b), (c), and (d) are iteratively performed by a predetermined number of iterations.

18 Claims, 9 Drawing Sheets

DECODING APPARATUS FOR LOW-DENSITY PARITY-CHECK CODES USING SEQUENTIAL DECODING, AND METHOD THEREOF

CROSS REFERENCE TO RELATED APPLICATION

This application claims priority to and the benefit of Korea Patent Application No. 10-2004-25345 filed on Apr. 13, 2004 in the Korean Intellectual Property Office, the entire content of which is incorporated herein by reference.

BACKGROUND OF THE INVENTION (a) Field of the Invention

The present invention relates to a decoding apparatus for LDPC (Low-Density Parity-Check) codes using sequential decoding, and a method thereof. More specifically, the present invention relates to a decoding apparatus for LDPC codes and a method thereof that decode LDPC codes when receiving data encoded with LDPC codes on a channel having consecutive output values.

(b) Description of the Related Art

LDPC codes are linear block codes invented by Gallager in 1962, and are defined as a sparse parity-check matrix in which most of the elements are zero.

The LDPC code was almost forgotten since the expense of its implementation was too high at that time. It was recently rediscovered, in 1995, and was improved as an irregular LDPC code by generalization in 1998.

A probabilistic decoding algorithm for the LDPC codes was also invented at the time of Gallager's first discovery of the LDPC codes. The performance of the LDPC codes decoded by the algorithm is remarkably high, and was more improved by expansion of a codeword from binary codes to nonbinary codes.

Like turbo codes, the LDPC codes have a bit error rate (BER) close to the Shannon channel capacity limit. Irregular LDPC codes known to have a highest performance only need 0.13 more dB from the Shannon channel capacity to get a bit error rate (BER) of $10^{-6}$ when its code length is about one million ($10^6$) bits in the additive white Gaussian noise (AWGN) channel environment. For that reason, the irregular LDPC codes are suitable for applications that require a high-quality transmission environment having an extremely low bit error rate (BER).

Message-passing decoding algorithms are used for decoding the LDPC codes. The most representative message-passing decoding algorithm is the sum-product algorithm. The sum-product algorithm uses summations and multiplications as basic operations of decoders, and its performance is determined by the construction method of check nodes and variable nodes of the LDPC codes.

Korean Patent Application No. 2001-50423 (filed on Aug. 21, 2001) by the applicant of the present invention discloses an invention under the title of "Apparatus for Adaptively Determining Maximum Number of Decoding Iterations for LDPC Decoder Using Signal-to-Noise Ratio Estimation, Method thereof, LDPC Decoding Apparatus Including the Apparatus, and Method thereof".

More specifically, the apparatus for adaptively determining the maximum number of decoding iterations for an LDPC decoder according to the cited invention estimates a signal-to-noise ratio corresponding to a received LDPC encoded signal, and adaptively determines the maximum number of decoding iterations corresponding to the estimated signal-to-noise ratio based on a memory storing maximum numbers of decoding iterations corresponding to various signal-to-noise ratios.

According to the cited invention, the signal-to-noise ratio corresponding to the received signal is estimated to adaptively determine the maximum number of decoding iterations that satisfies a required performance. This reduces the average number of decoding iterations and hence a delay of the signal, but disadvantageously increases the number of calculations.

Korean Patent Application No. 2002-34987 (filed on Jun. 21, 2002) describes an invention under the title of "Decoding Method of Error Correction Codes Using Approximation Function".

More specifically, the decoding method of error correction codes using an approximation function according to the cited invention is directed to a method for decoding error correction codes using an approximation function so as to simplify the decoding operation when using the approximation function for a decoding process of error correction codes in a digital data receiver. The decoding method includes: selecting a function containing no negative values and that is symmetrical about a function axis; dividing a variable interval into at least three intervals, and selecting a linear function approximating the function by the respective intervals; performing an operation on two input message values to determine the variable interval for the two values; operating the linear function corresponding to the interval to determine two function values; and determining the difference between the two function values. The cited invention simplifies the decoding function to reduce the number of calculations and is also applicable to other types of codes. The method is, however, simply reducing the number of calculations by simplification of the calculations using a function for reducing the number of decoding operations.

Korean Patent Application No. 2003-44955 (filed on Jul. 3, 2003) discloses an invention under the title of "Method and System for Decoding LDPC Codes".

More specifically, the cited invention provides a method for transmitting a message using LDPC codes. According to the cited invention, an input message is encoded to generate LDPC codes according to a parity-check matrix constructed to restrain a sub-matrix of the parity-check matrix. Here, the LDPC codes are transmitted on a wireless communication system (e.g., a satellite network), and a receiver on the wireless communication system iteratively decodes the received LDPC codes according to a signal constellation related to the LDPC codes. The receiver decodes the LDPC codes at least twice, and then iteratively regenerates a signal array bit matrix. The cited invention generates codes restraining a sub-matrix of the parity-check matrix of LDPC codes to facilitate encoding of the codes and uses a signal constellation for decoding the codes.

However, the decoding apparatus using the conventional message-passing decoding algorithm also generates update information for the respective variable nodes and collectively reflects the update information in the calculations to update a message for each node, so there is a demand for a larger size of memory that is necessary for message storage of a message-passing decoder and the convergence rate of the message-passing decoder is retarded.

SUMMARY OF THE INVENTION

It is an advantage of the present invention to provide a decoding apparatus for LDPC codes using sequential decoding, and a method thereof that can improve the decoding convergence rate of a sum-product algorithm in is a message-passing decoding algorithm for decoding LDPC codes.

It is another advantage of the present invention to provide a decoding apparatus for LDPC codes using sequential decoding and a method thereof that divide check nodes into several subsets to guarantee a high decoding performance even when the LDPC codes are decoded with a small number of decoding iterations.

It is still another advantage of the present invention to provide a decoding apparatus for LDPC codes using sequential decoding and a method thereof that can reduce the size of a memory necessary for message storage of a message-passing decoder.

It is further another advantage of the present invention to provide a decoding apparatus for LDPC codes using sequential decoding and a method thereof that can improve the convergence rate of a message-passing decoder to realize a high-speed decoding apparatus.

In one aspect of the present invention, there is provided a decoding method for LDPC codes using sequential decoding that includes: (a) dividing nodes into check nodes for a parity-check message and variable nodes for a bit message according to a parity-check matrix; (b) dividing the check nodes into a predetermined number of subsets; (c) sequentially decoding the LDPC codeword of each subset for all the check nodes; (d) generating an output message for verifying validity of the decoding result; and (e) iteratively performing the steps (b), (c), and (d) by a predetermined number of iterations.

The decoding method further includes: interrupting the decoding operation when the output message of the step (d) satisfies a defined decoding check equation.

The number of decoding iterations is reduced according to an increase in the convergence rate when the validity of the LDPC codeword is determined from the output message of the step (d). The number of decoding iterations is fixed at a value smaller than the maximum number of decoding iterations during the iterative decoding process.

Each of the subsets of the check nodes is decoded with a different priority. The subset for highest-order variable nodes connected to the check nodes is decoded with a highest priority.

The step (b) includes: dividing the check nodes into subsets, each having a different number of elements.

The number of the subsets is an integer other than a divisor of the number of the check nodes.

The step (e) includes: changing the decoding order of the subsets used in a previous decoding operation when the number of decoding iterations is increased. Here, the decoding order used in the previous decoding operation is reversed, or a new decoding priority to the subsets is determined.

The decoding priority to the subsets of the check nodes is differentiated according to the number of decoding iterations.

In another aspect of the present invention, there is provided a decoding apparatus for LDPC codes using sequential decoding that includes: a codeword regenerator for regenerating the LDPC codes received through a channel into a codeword for decoding; a message-passing decoder for sequentially decoding the LDPC codeword of each subset for all check nodes, the check nodes being divided into a predetermined subsets; and an information-restoring section for determining whether there is an error in the decoded codeword, and extracting and transmitting information when there is no error in the codeword.

The message-passing decoder exchanges messages through defined edges between check nodes for a parity-check message and variable nodes for a bit message according to a parity-check matrix to update a node message.

The number of subsets is equal to or greater than a maximum order of the variable nodes. Each of all the edges connected to a specific one of the variable nodes is included in a different subset.

The message-passing decoder includes: a parity-check matrix memory for storing a parity-check matrix; an input buffer memory for storing an input message; a variable node message updater for receiving an input from the input buffer memory and a check node output memory and processing an output message of the variable nodes according to the stored parity-check matrix; a variable node output memory for storing a result of the variable node message updater; a check node processor for receiving data stored in the variable node output memory to process the output message of the check nodes, and transmitting the processed output message to the variable node message updater; a check node output memory for storing a processing result of the output message of the check nodes; an output buffer memory for transmitting the decoding result to the information-restoring section so as to verify validity of the decoding result, after completion of the decoding operation for all the subsets; and a decoding operation controller for determining all kinds of operations related to the decoding operation.

The data of the variable node output memory are message-updated as often as the number of the subsets are.

After the completion of the decoding operation on one subset, the connection state of nodes and edges in the variable node message updater and the check node processor is loaded from the decoding operation controller to reset nodes and edges for a next subset.

The decoding operation of the message-passing decoder is iteratively performed with a predetermined number of decoding iterations.

The present invention is for improving the decoding convergence rate of a sum-product algorithm among the message-passing decoding algorithms for decoding LDPC codes. The check nodes for a decoder of LDPC code are divided into several subsets and sequentially decoded with a different decoding priority assigned to each of the subsets. Here, the subsets of the check nodes are constructed by a defined construction method, and each subset of check nodes functions as one independent message-passing decoder.

The present invention assigns a different decoding priority to each of the subsets of the check nodes, so the update information calculated for a highest-priority subset is reflected on the message updating of the next subset. This method improves a decoding performance due to the update result of the upper-priority subset of check nodes relative to the conventional message-passing decoding algorithm but has the same calculation complexity because it differs from the conventional message-passing decoding algorithm only in the decoding priority of each subset. In addition, the message-passing decoding using the method of the present invention reduces the size of a memory necessary for message storage of a message-passing decoder and improves the convergence rate of the message-passing decoder to guarantee a high speed of the implemented decoder.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which similar descriptions are provided have the same reference numerals.

Hereinafter, a decoding apparatus for LDPC codes using sequential decoding and a method thereof according to an embodiment of the present invention will be described in detail with reference to the accompanying drawings.

The embodiment of the present invention is directed to a construction method of a message-passing decoding algorithm for decoding data encoded with LDPC codes as received on a channel having consecutive output values in which check nodes in the decoder are divided into several subsets, each being decoded with a predetermined priority, and a decoding apparatus having a function thereof.

The decoding apparatus for LDPC codes using sequential decoding and the method thereof can be applied to decoding of block codes encoded with LDPC codes.

Figure 1:
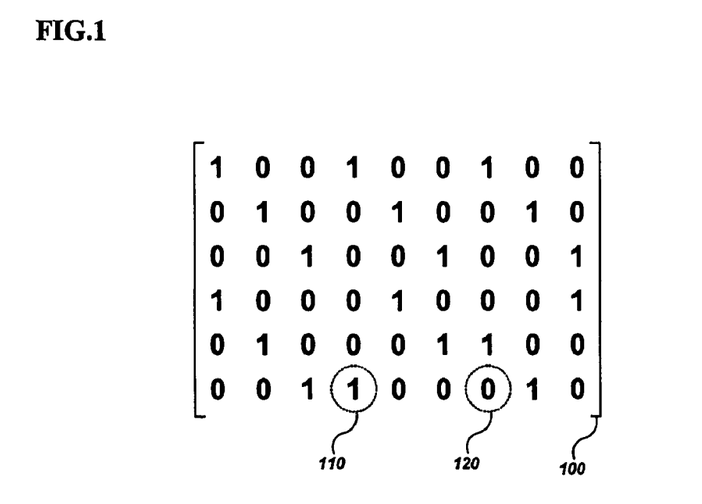
FIG. 1 is an exemplary illustration of a parity-check matrix of LDPC codes.
Figure 2:
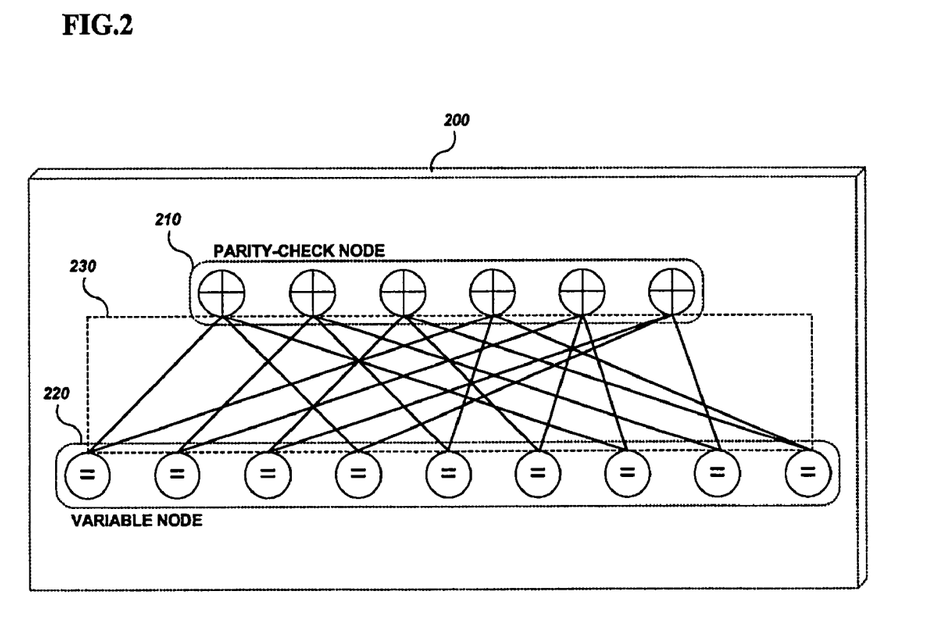
FIG. 2 shows a Tanner graph for the parity-check matrix of FIG. 1.

FIG. 1 is an exemplary diagram of a parity-check matrix of LDPC codes, and FIG. 2 is a Tanner graph 200 for the parity-check matrix of FIG. 1.

Referring to FIGS. 1 and 2, the LDPC codes are encoded/decoded using a sparse parity-check matrix 100 with a considerably small number of nonzero elements 120 other than zero (0) elements 110, and an associated parity-check matrix.

In decoding the LDPC codes, a Tanner graph 200 is defined from the sparse parity-check matrix 100, and a message-passing algorithm is applied to the graph.

The Tanner graph 200 comprises nodes 210 and 220, and branches 230. The nodes 210 and 220 are divided into parity-check nodes 210 for a parity-check message, and bit nodes 220 for a bit message. The number of the parity-check nodes 210 is equal to the length of the column in the parity-check matrix 100, and the number of the bit nodes 220 is equal to the length of the row in the parity-check matrix 100. The nodes 210 and 220 represent the rows and columns of the matrix, respectively. The branches 230 denote nonzero elements in the parity-check matrix 100.

The leftmost branch of FIG. 2 connects the first parity-check node 210 and the first bit node 220 to denote the element (1, 1) of the parity-check matrix 100. Likewise, the branch 230 connecting the first bit node 220 and the fourth parity-check node 210 denotes the element (4, 1) of the parity-check matrix 100. The codes constructed in this way have a completely random structure.

There are two kinds of LDPC codes according to whether the order of the nodes 210 and 220 is regular or not. The LDPC code with the regular order of the nodes 210 and 220 is called "regular LDPC code", while the LDPC code with the irregular order of the nodes 210 and 220 is called "irregular LDPC code".

The above defined parity-check matrix 100 and the Tanner graph 200 concerned are used for encoding and decoding.

Figure 3:
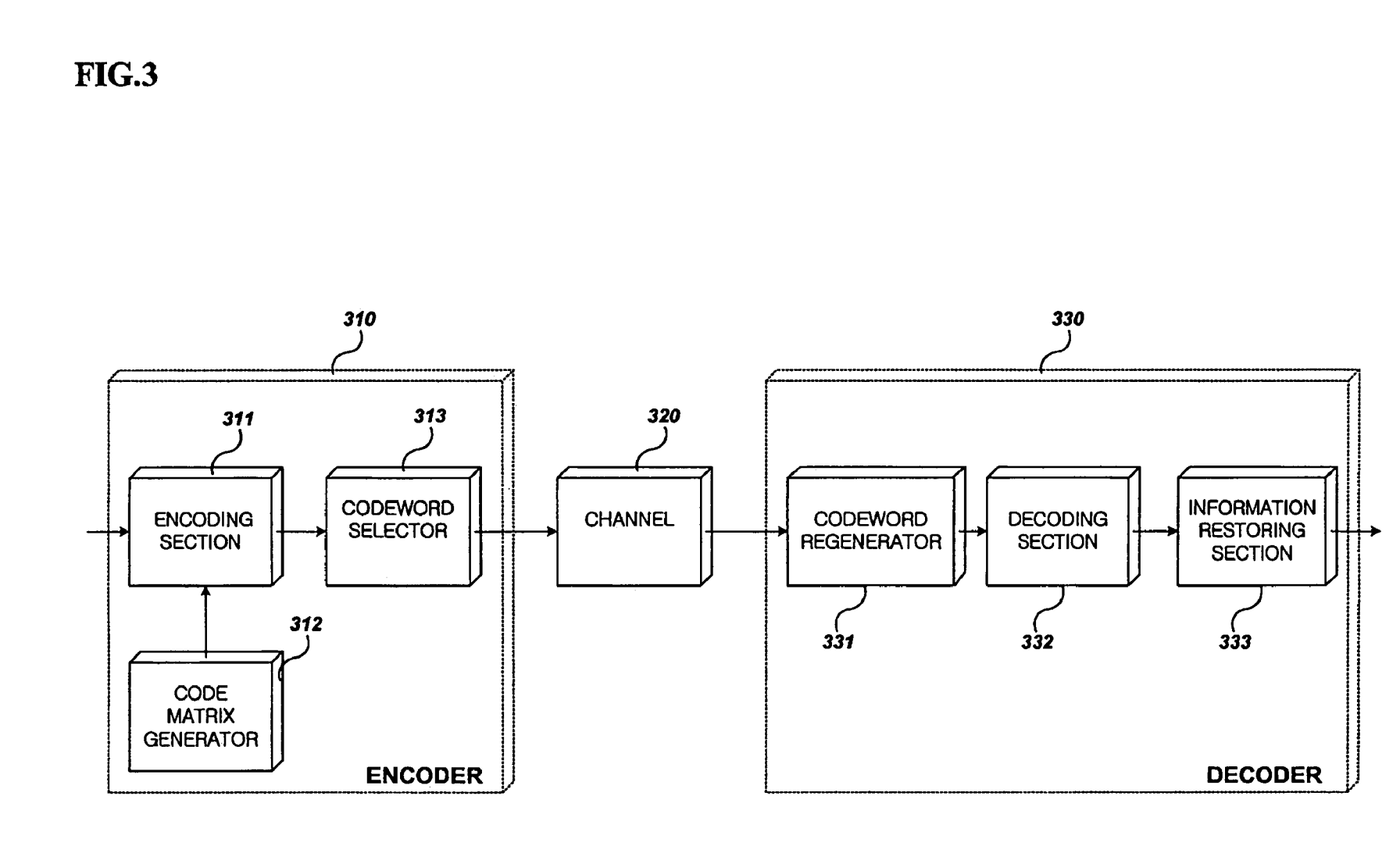
FIG. 3 is a schematic of an encoder/decoder for LDPC codes.

FIG. 3 is a schematic of an encoder 310 and a decoder 330 for LDPC codes.

Referring to FIG. 3, the encoder 310 comprises an encoding section 311, a code matrix generator 312, and a codeword selector 313. The decoder 330 comprises a codeword regenerator 331, a decoding section 332, and an information-restoring section 333.

When an information word having a length of k is fed into the encoder 310, the encoding section 311 receives a parity-check matrix of FIG. 1 from the code matrix generator 312 to generate a codeword having a length of n.

The codeword selector 313 is a component for generating codes to be actually transmitted from the encoding section 311 through a channel 320. The operation of the codeword selector 312 includes puncturing, padding, or the like.

The codeword passing through the channel 320 is transmitted to the decoder 330 and regenerated into a decoding codeword having a length of n by the codeword regenerator 331. The decoding section 332 decodes the regenerated codeword by a message-passing decoding. The information-restoring section 333 determines whether the decoded codeword has an error, and extracts actual information when there is no error in the codeword.

Figure 4:
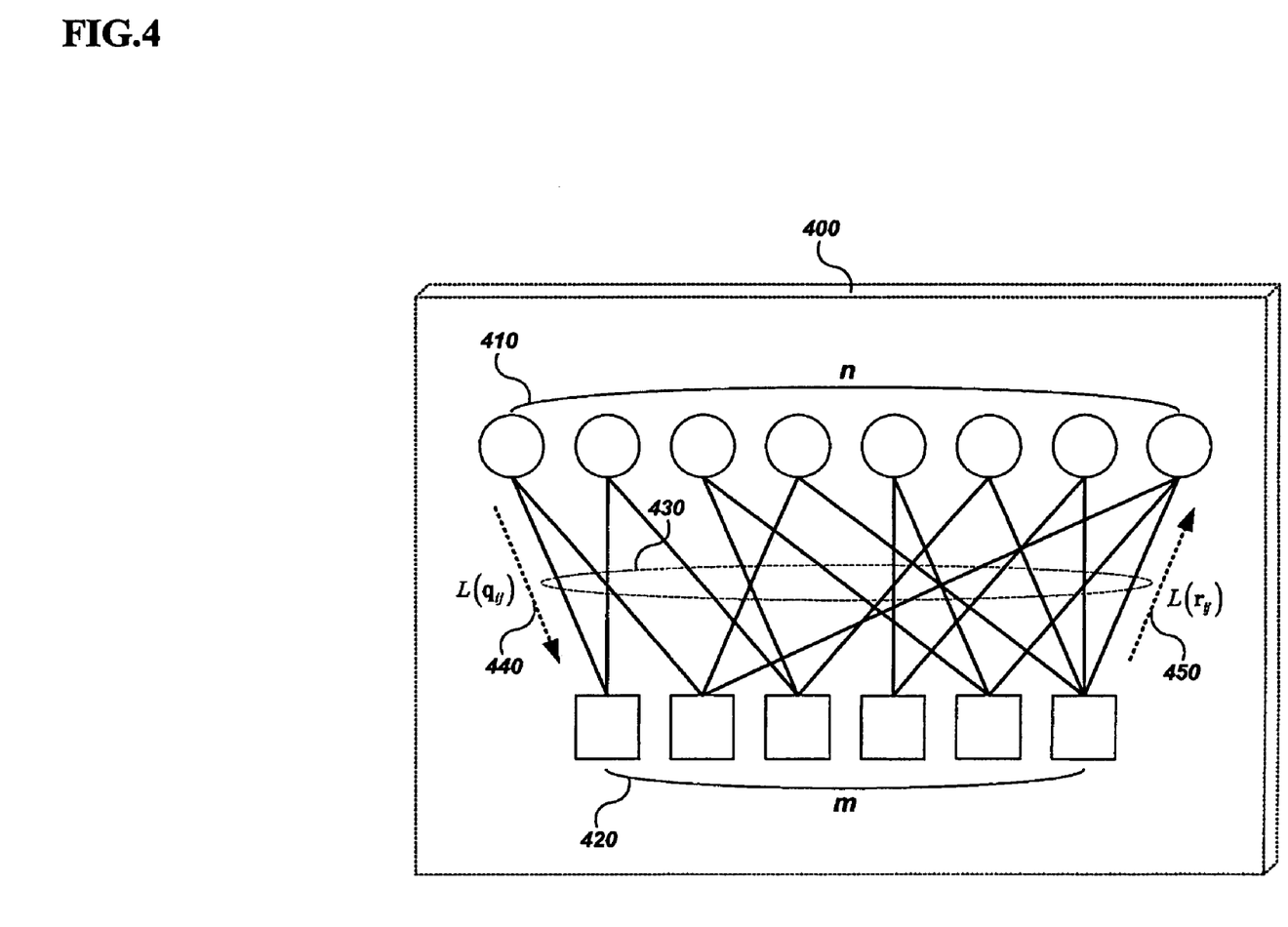
FIG. 4 is a diagram showing a message-passing decoding algorithm operated in the decoder of FIG. 3.

FIG. 4 is an illustration of a message-passing decoding algorithm operated in the decoding section 332 of FIG. 3 and shows a message-passing decoder 400 used as a general decoding algorithm for LDPC codes.

In the message-passing decoder 400, a log likelihood ratio (LLR) is calculated from the signal passing through the channel 220 of FIG. 3 and fed into N variable nodes 410.

In the message-passing decoder 400, N variable nodes 410 and M check nodes 420 exchange messages 440 and 450 through a defined edge 430 to update the node message.

During an initialization, the output message of the variable node 410 is defined as the following Equation 1.

$$L(q_{ij}) = L(x_j) \qquad \text{[Equation 1]}$$

In the Equation 1, $L(q_{ij})$ is the output message of the variable node 410, and $L(x_j)$ is the input message of the variable node 410 transmitted from the channel. Namely, the output message of the variable node 410 is the same as the input message of the variable node 410 transmitted from the channel during the initialization.

The output message 450 of the check node 420 is calculated according to the following Equation 2.

$$L(r_{ij}) = \left( \left( \prod_{j^* \in R(i)/j} \mathrm{sgn}(L(q_{ij^*})) \right) \cdot \phi\left( \sum_{j^* \in R(i)/j} \phi(|L(q_{ij^*})|) \right) \right) \quad \text{[Equation 2]}$$

Here, $L(r_{ij})$ 450 is the output message of the i-th check node 420 fed into the j-th variable node 410; R(i) is an index set of the variable nodes connected to the check nodes i 420; and R(i)/j is an index set of the variable nodes connected to the check nodes i 420 other than j.

The output message of each variable node 410 after the initialization is given by the following Equation 3.

$$L(q_{ij}) = L(x_j) + \left( \sum_{i^* \in C(j)/i} L(r_{i^*j}) \right) \quad \text{[Equation 3]}$$

Here, C(j) is an index set of check nodes 420 connected to the variable nodes j 410; and C(j)/i is an index set of the check nodes 420 connected to the variable nodes j 410 other than i. The message passed to the information-restoring section 333 after processing each variable node 410 and each check node 420 is calculated according to the following Equation 4.

$$L(Q_i) = L(x_j) + \left( \sum_{i^* \in C(j)} L(r_{i^*j}) \right) \quad \text{[Equation 4]}$$

Here, $L(Q_i)$ is an updated vector of LLR for each bit of the i-th partial codeword. The respective components in the vector are operated with one another, for the function and the calculation of the vectors according to the Equation 4. The information-restoring section 333 that is a data decoder arranges the output vector messages $L(Q_i)$ of the decoding section 332 in sequence to generate a message. Then, the codeword is decided from the generated message according to the following Equation 5.

$$\hat{x}_i = \begin{cases} 1 & \text{if } L(Q_i) < 0, \\ 0 & \text{otherwise} \end{cases} \quad \text{[Equation 5]}$$

Figure 5A:
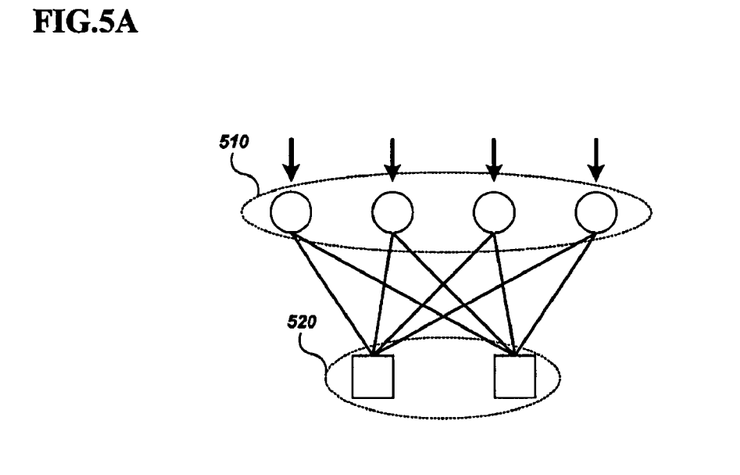
FIGS. 5a, 5b, and 5c show a one-cycle iteration decoding process of a (2,4) regular LDPC code having a length of 4 according to an embodiment of the present invention.
Figure 5B:
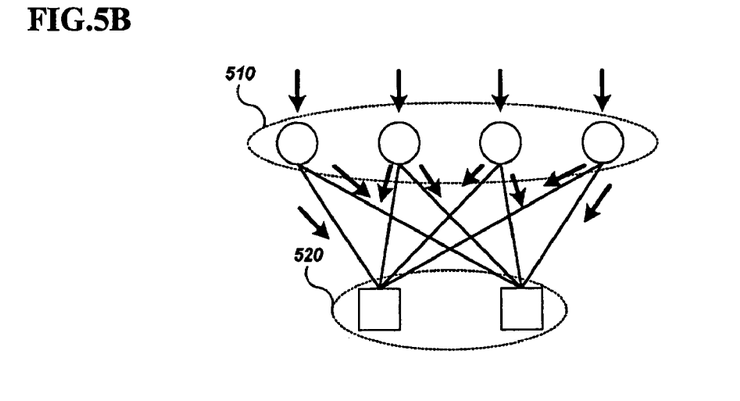
Figure 5C:
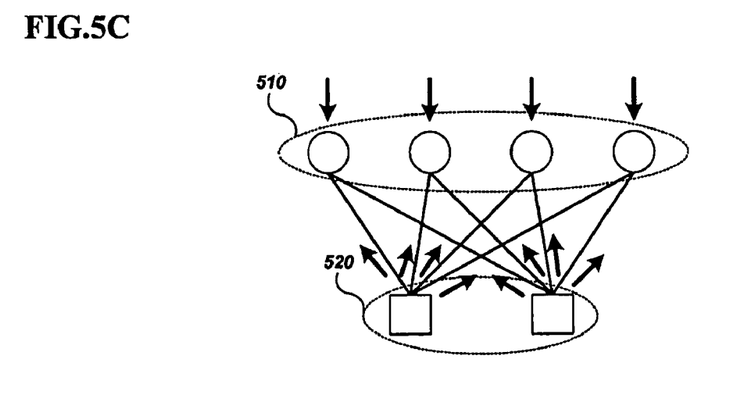

FIGS. 5a, 5b, and 5c show a one-cycle iteration decoding process of a (2,4) regular LDPC code having a length of 4 according to an embodiment of the present invention. The message-passing decoder 400 of FIG. 4 iterates the operations of the Equations 1 to 4 to exchange messages between variable nodes 510 and check nodes 520 for decoding.

Hereinafter, an apparatus and method for decoding LDPC codes according to an embodiment of the present invention will be described.

Figure 6:
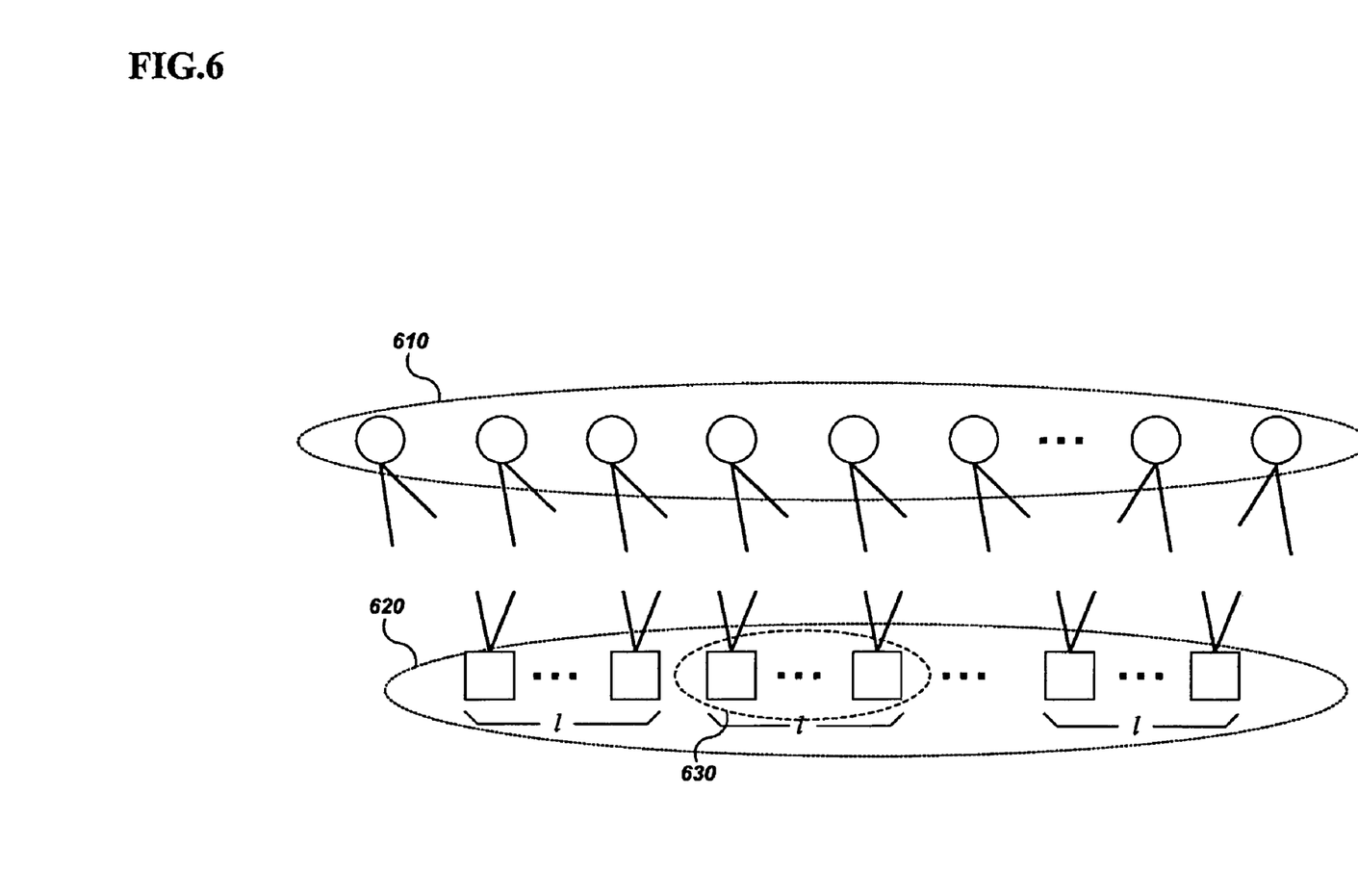
FIG. 6 shows a graph that check nodes are divided by a size l into p subsets in a decoding method of LDPC codes using sequential decoding according to an embodiment of the present invention.
Figure 7A:
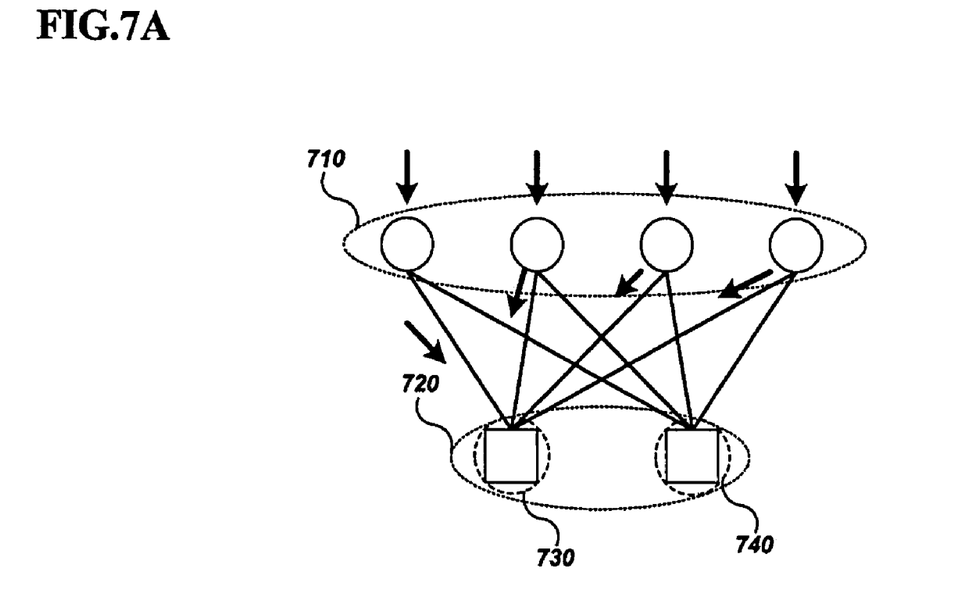
FIGS. 7a to 7d show a one-cycle iteration decoding process of LDPC codes using sequential decoding when check nodes are divided into subsets according to an embodiment of the present invention.
Figure 7B:
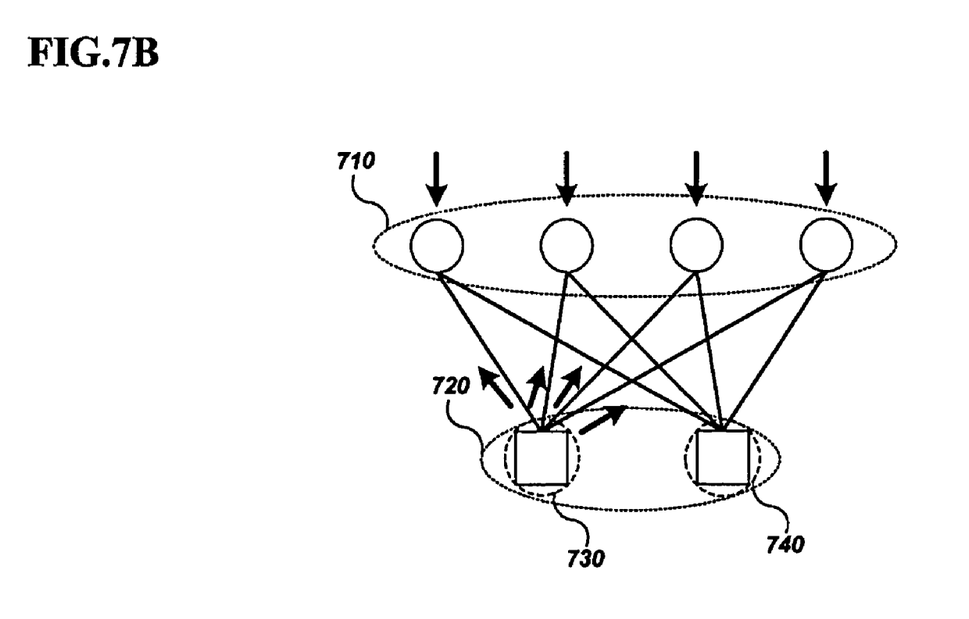
Figure 7C:
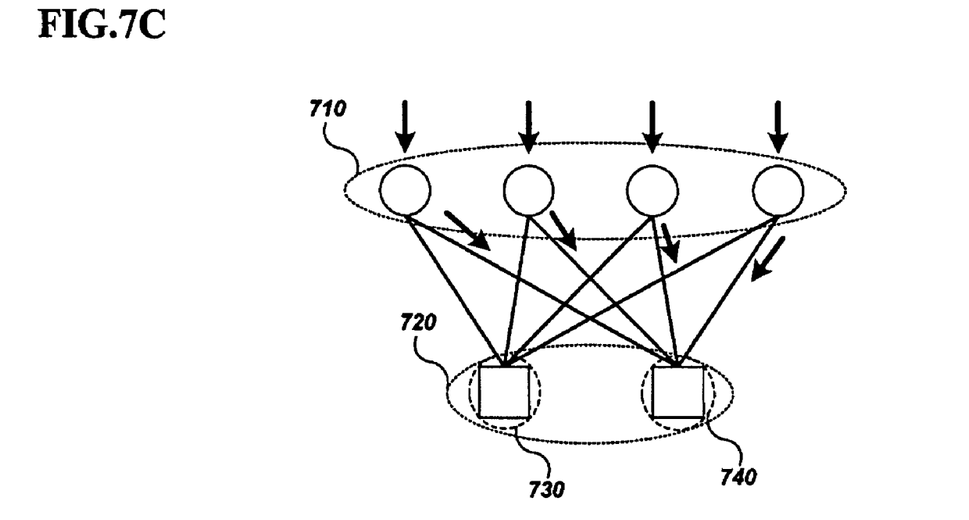
Figure 7D:
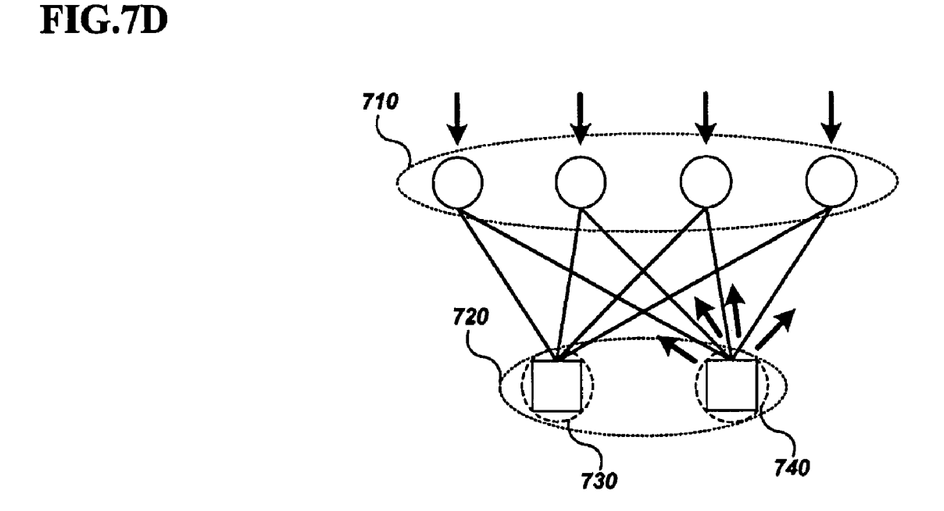

FIG. 6 shows a graph in which check nodes are divided by a size l into p subsets. The check nodes 620 are divided into subsets 630.

Referring to FIG. 6, a regular LDPC code has a code length of n, and the number of check nodes 620 is m. There may be various methods of dividing the check nodes 620 into several subsets 630. Here, a description will be given as to a simplest method that constructs subsets having a constant number of elements.

The check nodes 620 are divided into subsets 630 having l elements by a defined method. So, the number p of the subsets of the check nodes 620 is p=m/l.

The subset construction method that the number of elements of the subsets 630 is not constant shows a similar decoding performance to the subset construction method in which the number of elements is constant. But, the method that the subsets 630 have a different number of elements can have higher performance according to the connection state of the edges connecting the nodes 610 and 620 in the LDPC codes. For example, the performance is all the same in many cases when the number of the subsets 630 optionally determined is constant for irregular LDPC codes constructed to have an irregular number of variable nodes 610 connected to the check nodes 620. Namely, the decoding performance is almost the same when the total number p of the subsets 630 is constant even though each subset 630 has a different number of elements.

The number of the subsets 630 is determined by the characteristic of the codes generated. Generally, it is advantageous in the aspect of coding that the number p of the subsets 630 is equal to or greater than the maximum order in the variable nodes 610. When the number of the subsets 630 is less than the maximum order, it becomes problematic in the aspect of decoding order or decoding independence because there is a case in which one variable check 610 is connected to two check nodes 620 in the subset 630.

The addition of a condition that all the edges connected to a specific variable node 610 are included in different subsets 630 may enhance the decoding performance.

FIGS. 7a to 7d show a one-cycle iteration decoding process of LDPC codes using sequential decoding when check nodes are divided into subsets according to an embodiment of the present invention, for a (2,4) regular LDPC code having a length of 4 when the number p of the subsets is 2. Namely, FIGS. 7a to 7d shows a decoding method of the decoding section 332 when the check nodes are divided into p subsets. Expediently, a (2,4) regular LDPC code having a length of 4 is used herein as in the embodiment of FIGS. 5a, 5b, and 5c.

For p=2, the number of subsets 730 and 740 is 2, and the groups 730 and 740 of l (=4) variable nodes 710 are the subsets 730 for one check node 720.

Hence, there are p(=2) subsets in this embodiment of the present invention, and each of the subsets 730 and 740 is considered as one sub-code, which functions as a unit decoder. This is similar to the structure of a decoder for Turbo codes that comprises at least two unit decoders each transmitting independent extrinsic information to another decoder using an interleaver.

The decoding operations of the Equations 1 to 4 are performed in the respective subsets 730 and 740. In the operation of the Equation 2 according to the embodiment of the present invention, the inputs for the check nodes 720 are divided into a variable node message updated by the subsets 730 of the previous check nodes and a non-updated variable node message.

The operation of the check nodes 720 can be expressed as the following Equation 6.

$$L(r_{ij}) = \left( \prod_{j^* \in R_0(i)/j} \mathrm{sgn}(L(q_{ij^*})) \cdot \prod_{j^* \in R_1(i)/j} \mathrm{sgn}(L(q_{ij^*})) \right) \cdot \quad \text{[Equation 6]}$$
$$\phi\left( \sum_{j^* \in R_0(i)/j} \phi(|L(q_{ij^*})|) + \sum_{j^* \in R_1(i)/j} \phi(|L(q_{ij^*})|) \right)$$

Here, $R_0(i)$ and $R_1(i)$ are an index set of the variable nodes 710 connected to the check nodes i 720; $R_0(i)/j$ is an index set of non-updated variable nodes 710 connected to the check nodes i 720 other than j; and $R_1(i)/j$ is an index set of variable nodes 710 connected to the check nodes i 720 other than j and already updated by the previous subsets 730.

The operation for the variable nodes 710 and the subsequent operations are the same as described in the Equations 3, 4, and 5.

Figure 8:
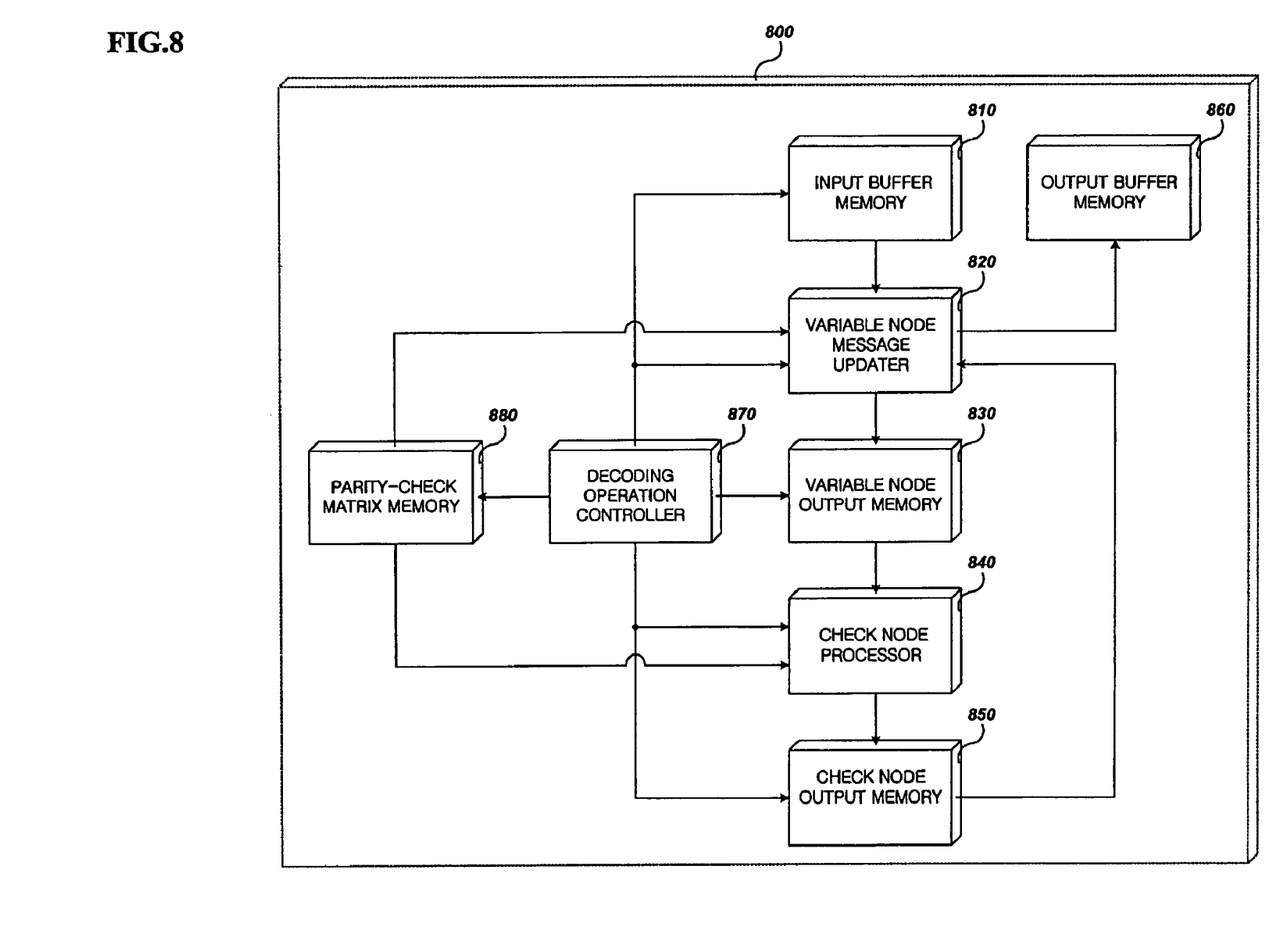
FIG. 8 is a schematic of a decoder for LDPC codes using sequential decoding according to an embodiment of the present invention.

FIG. 8 is a schematic of a decoder 800 for LDPC codes using sequential decoding according to an embodiment of the present invention.

Referring to FIG. 8, the decoder 800 according to an embodiment of the present invention comprises an input buffer memory 810, a variable node message updater 820, a variable node output memory 830, a check node processor 840, a check node output memory 850, an output buffer memory 860, a decoding operation controller 870, and a parity-check matrix memory 880.

First, the input buffer memory 810 stores an input message of the decoder 800. The variable node message updater 820 receives an input from the input buffer memory 810 and the check node output memory 850 and performs the operation of the Equation 1 or 3, i.e., processes the output message of the variable nodes after the initialization according to the Equation 1 or 3.

The variable node output memory 830 stores the processing result. The check node processor 840 receives the stored data and performs the operation of the Equation 2, i.e., processes the output message of the check nodes according to the Equation 2.

Subsequently, the check node output memory 850 stores the processing result of the output message of the check nodes. The stored data are updated by the variable check message updater 820 and then stored in the variable node output memory 830 again.

The data of the variable node output memory 830 are message-updated as often as the number of the subsets. After the completion of the decoding operation on one subset, the connection state of nodes and edges in the variable node memory updater 820 and the check node processor 840 is loaded from the decoding operation controller 870 to reset nodes and edges for the next subset.

After the completion of the iterative operation for all the subsets, the decoding result is transmitted to the information-restoring section 333 through the output buffer memory 860 to verify its validity.

This process is iterated a predetermined number of iteration times. The decoding operation controller 870 determines all kinds of operations related to the decoding operation.

In the decoding method for LDPC codes according to an embodiment of the present invention, the check nodes are divided into several subsets during the decoding process, and the subsets are decoded according to their priority with several decoders. Here, the convergence rate for a bit error rate is variable according to the determination method of the subsets. The higher convergence rate means higher enhancement of the code performance with a smaller number of decoding iterations. Compared with the general LDPC decoding method, this decoding method only changes the order of operations of the decoder without increasing the complexity.

The embodiment of the present invention can decode a codeword with a smaller number of decoding iterations in most of the cases of iterative decoding of LDPC codes. Relative to the conventional method, the method of the present invention has much enhanced performance in the situation that the number of decoding iterations is small. In addition, the method of determining the codeword upon interruption of the decoding in the middle of the decoding process while the parity-check equation of the Equation 6 is satisfied may reduce the time taken for the decoding and show a higher performance for the same complexity as compared with the conventional method.

Figure 9:
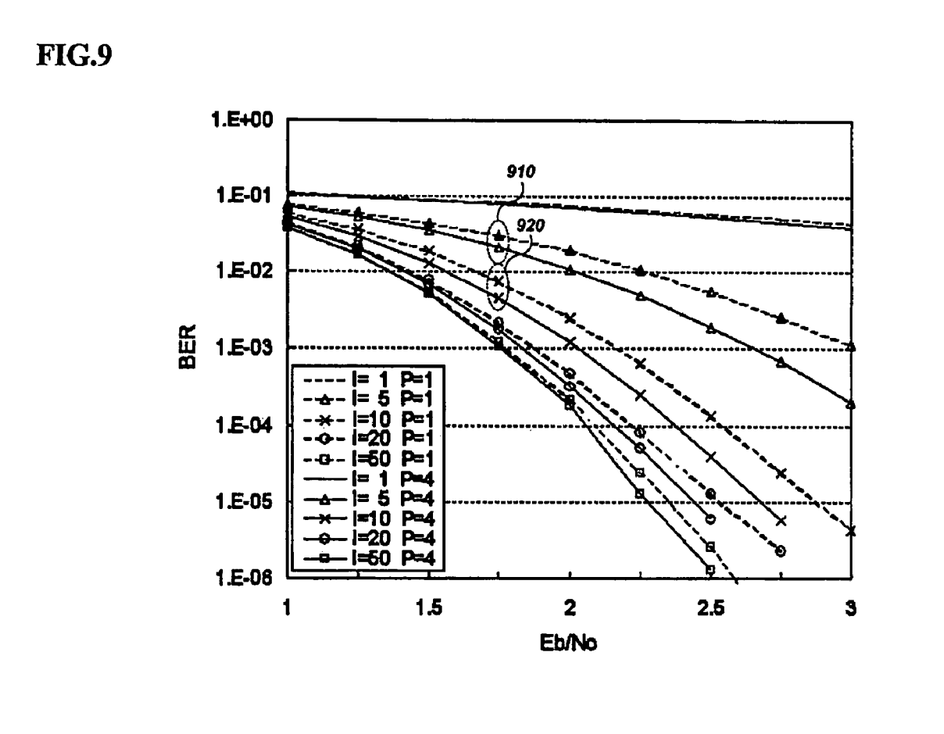
FIG. 9 shows a performance graph according to the number of decoding iterations and the number of subsets of irregular LDPC codes having a codeword length of 1000 and a code rate of 1/2; and, FIG. 10 shows a performance graph according to the number of decoding iterations and the number of subsets of (3, 6) regular LDPC codes having a codeword length of 4092 and a code rate of 1/2.
Figure 10:
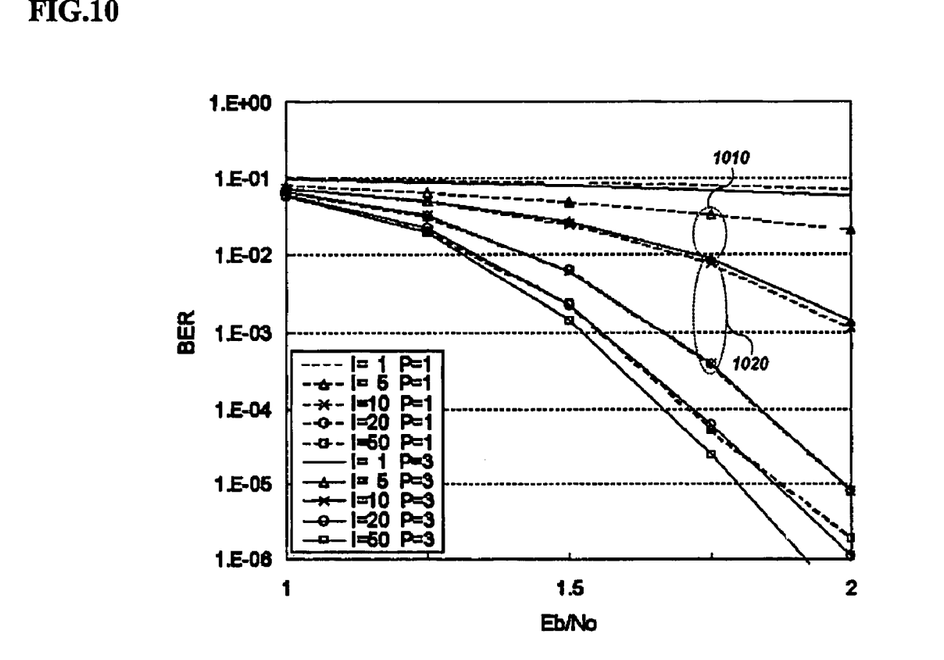

FIGS. 9 and 10 show the results of a simulation for performance evaluation of the decoding method. Here, the channel environment is assumed as an additive white Gaussian noise (AWGN) channel. The message determined at each node, which is exchanged through the edge, carries a log likelihood ratio (LLR).

FIG. 9 shows a performance graph according to the number of decoding iterations and the number of subsets of irregular LDPC codes having a codeword length of 1000 and a code rate of 1/2. FIG. 10 shows a performance graph according to the number of decoding iterations and the number of subsets of (3, 6) regular LDPC codes having a codeword length of 4092 and a code rate of 1/2.

In the embodiment of the present invention, the number of the subsets is a divisor of the total number of check nodes, and the respective subsets are all the same in the number of elements. The value p is 1, 3, or 4, where the decoding method for p=1 is the same as the conventional message-passing algorithm. In the figure, I means the number of decoding iterations.

Referring to FIG. 9, the decoding performance for irregular IDPC codes having a codeword length of 1000 and a code rate of 1/2 is shown over a bit error ratio (BER) for a signal-to-noise ratio $$\frac{E_b}{N_0}.$$

When p is greater than 2, the decoding performance is higher even with a small number of decoding iterations (in curves 910 and 920). But, the decoding performance approaching the maximum performance of the codes is not so enhanced with a large number of decoding iterations.

Referring to FIG. 10, the decoding performance for regular IDPC codes having a codeword length of 4092 and a code rate of 1/2 is shown. In FIG. 10, the decoding performance with a small number of decoding iterations (in curves 1010 and 1020) is much more enhanced than in FIG. 9. The reason for this is that the number of elements in the subsets increases for a small number of decoding iterations with a four-fold increase in the codeword length of the LDPC codes, i.e., from 1000 to 4092, to enhance the message updating effect of the unit codes. Also, in the case of the irregular LDPC codes of FIG. 9, the enhancement of the decoding performance increases with an increased length of the codeword.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the present invention assigns a priority to each subset of the check nodes for decoding in the conventional decoding method of LDPC codes to provide a higher decoding performance with a small number of decoding iterations and almost the same complexity. In addition, the present invention hastens the decision of the decoding success/failure in the decoder and hence guarantees high speed decoding by the reduction of the decoding time.

What is claimed is:

1. A method for a decoding apparatus to decode, the method comprising:
   (a) dividing, by a message-passing decoder of the decoding apparatus, nodes into check nodes for a parity-check message and variable nodes for a bit message according to a parity-check matrix;
   (b) dividing, by the message-passing decoder of the decoding apparatus, the check nodes into a predetermined number of subsets;
   (c) sequentially decoding, by the message-passing decoder of the decoding apparatus, a LDPC (Low Density Parity Check) codeword of each subset for all the check nodes;
   (d) generating, by the message-passing decoder of the decoding apparatus, an output message for verifying validity of the decoding result; and
   (e) iteratively performing, by the message-passing decoder of the decoding apparatus, the steps (b), (c), and (d) by a predetermined number of iterations, wherein the number of decoding iterations is reduced according to an increase in the convergence rate when the validity of the LDPC codeword is determined from the output message of the step (d).

2. The method as claimed in claim 1, further comprising: interrupting the decoding operation when the output message of the step (d) satisfies a defined decoding check equation.

3. The method as claimed in claim 1, wherein the number of decoding iterations is fixed at a value smaller than the maximum number of decoding iterations during the iterative decoding process.

4. The method as claimed in claim 1, wherein each of the subsets of the check nodes is decoded with a different priority.

5. The method as claimed in claim 4, wherein the subset for highest-order variable nodes connected to the check nodes is decoded with a highest priority.

6. The method as claimed in claim 1, wherein the step (b) comprises: dividing the check nodes into subsets each having a different number of elements.

7. The method as claimed in claim 6, wherein the number of the subsets is an integer other than a divisor of the number of the check nodes.

8. A method for a decoding apparatus to decode, the method comprising:
   (a) dividing, by a message-passing decoder of the decoding apparatus, nodes into check nodes for a parity-check message and variable nodes for a bit message according to a parity-check matrix;
   (b) dividing, by the message-passing decoder of the decoding apparatus, the check nodes into a predetermined number of subsets;
   (c) sequentially decoding, by the message-passing decoder of the decoding apparatus, a LDPC (Low Density Parity Check) codeword of each subset for all the check nodes;
   (d) generating, by the message-passing decoder of the decoding apparatus, an output message for verifying validity of the decoding result; and
   (e) iteratively performing, by the message-passing decoder of the decoding apparatus, the steps (b), (c), and (d) by a predetermined number of iterations, wherein the step (e) comprises: changing the decoding order of the subsets used in a previous decoding operation when the number of decoding iterations is increased.

9. The method as claimed in claim 8, comprising: reversing the decoding order used in the previous decoding operation, or determining a new decoding priority to the subsets.

10. The method as claimed in claim 8, comprising: differentiating the decoding priority to the subsets of the check nodes according to the number of decoding iterations.

11. An apparatus comprising:
    a codeword regenerator for regenerating LDPC codes received through a channel into a codeword for decoding;
    a message-passing decoder for sequentially decoding the LDPC codeword of each subset for all check nodes, the check nodes being divided into predetermined subsets, wherein the message-passing decoder comprises:
       a parity-check matrix memory for storing a parity-check matrix,
       an input buffer memory for storing an input message, and
       a variable node message updater for receiving an input from the input buffer memory and a check node output memory and processing an output message of the variable nodes according to the stored parity-check matrix; and
    an information-restoring section for determining whether there is an error in the decoded codeword, and extracting and transmitting information when there is no error in the codeword.

12. The apparatus as claimed in claim 11, wherein the message-passing decoder exchanges messages through defined edges between check nodes for a parity-check message and variable nodes for a bit message according to a parity-check matrix to update a node message.

13. The apparatus as claimed in claim 12, wherein the number of subsets is equal to or greater than a maximum order of the variable nodes.

14. The apparatus as claimed in claim 12, wherein each of all the edges connected to a specific one of the variable nodes is included in a different subset.

15. The apparatus as claimed in claim 11, wherein the message-passing decoder comprises:
    a variable node output memory for storing a result of the variable node message updater;
    a check node processor for receiving data stored in the variable node output memory to process the output message of the check nodes, and transmitting the processed output message to the variable node message updater;
    a check node output memory for storing a processing result of the output message of the check nodes;
    an output buffer memory for transmitting the decoding result to the information-restoring section so as to verify validity of the decoding result, after completion of the decoding operation for all the subsets; and
    a decoding operation controller for determining all kinds of operations related to the decoding operation.

16. The apparatus as claimed in claim 15, wherein the data of the variable node output memory are message-updated as often as the number of the subsets.

17. The apparatus as claimed in claim 15, wherein after the completion of the decoding operation on one subset, the connection state of nodes and edges in the variable node message updater and the check node processor is loaded from the decoding operation controller to reset nodes and edges for a next subset.

18. The apparatus as claimed in claim 11, wherein the decoding operation of the message-passing decoder is iteratively performed with a predetermined number of decoding iterations.

* * * * *